(12) United States Patent
Tseng et al.

(10) Patent No.: US 6,559,043 B1
(45) Date of Patent: May 6, 2003

(54) METHOD FOR ELECTRICAL INTERCONNECTION EMPLOYING SALICIDE BRIDGE

(75) Inventors: Shih-der Tseng, Hsin-Chu (TW); Kuo-Ho Jao, Toufen (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/043,482

(22) Filed: Jan. 11, 2002

(51) Int. Cl.[7] .......................... H01L 21/4763
(52) U.S. Cl. .................. 438/618; 438/647; 438/649; 438/677; 438/739
(58) Field of Search ................ 438/618, 647, 438/649, 677, 739

(56) References Cited

U.S. PATENT DOCUMENTS

| | | | |
|---|---|---|---|
| 4,374,700 A | * 2/1983 | Scott et al. | 438/586 |
| 4,657,628 A | 4/1987 | Holloway et al. | 156/643 |
| 5,010,032 A | 4/1991 | Tang et al. | 437/57 |
| 5,066,995 A | * 11/1991 | Young et al. | 257/371 |
| 5,124,280 A | * 6/1992 | Wei et al. | 438/618 |
| 5,405,806 A | * 4/1995 | Pfiester et al. | 438/630 |
| 5,672,901 A | * 9/1997 | Abernathey et al. | 257/413 |
| 6,083,847 A | 7/2000 | Kuo | 438/745 |
| 6,096,639 A | 8/2000 | Dawson et al. | 438/649 |
| 6,100,191 A | 8/2000 | Lin et al. | 438/661 |
| 6,117,761 A | 9/2000 | Manning | 438/618 |

OTHER PUBLICATIONS

H. C. Chang and C. Y. Chang, "Technologic Handbook of Integar Circuit Process and Apparatus," pp. 316–318, 1997, Chinese Association for Industrial Advancement & Chinese Association of Electronic Material and Device.

* cited by examiner

Primary Examiner—T. N. Quach
(74) Attorney, Agent, or Firm—George O. Saile; Stephen B. Ackerman (57) ABSTRACT

A method for forming within a substrate employed within a microelectronics fabrication an electrical interconnection cross-over bridging between conductive regions separated by non-conductive regions formed within the substrate. There is formed over a substrate provided with conductive and non-conductive regions a blanket dielectric layer and a blanket polysilicon layer. After patterning the polysilicon and dielectric layers. A portion of the dielectric layer at the periphery of the polysilicon layer is etched away, leaving a gap between the polysilicon patterned layer and the underlying substrate contact region. There is formed over the substrate a layer of refractory metal and after rapid thermal annealing, there is formed a surface layer of refractory metal silicide over the surfaces of the polysilicon layer and within the gap between the polysilicon layer and the substrate, completing the electrical connection.

17 Claims, 4 Drawing Sheets

METHOD FOR ELECTRICAL INTERCONNECTION EMPLOYING SALICIDE BRIDGE

BACKGROUND OF THE INVENTION

1. Field of the Invention

The invention relates to the field of electrical interconnection within microelectronics fabrications. More particularly, the invention relates to the field of patterned self-aligned silicide layers for electrical interconnection within microelectronics fabrications.

2. Description of the Related Art

Microelectronics fabrications employ layers of microelectronics materials formed over substrates and into patterns to embody the active devices and other components which are interconnected to form the circuitry of the microelectronics fabrication. The formation of low resistance electrical interconnections is an important factor in achieving the desired circuit performance in such microelectronics fabrications. Increased density of components employed within microelectronics fabrications has resulted in closer spacing between the structures which constitute the components. This places even greater emphasis on the need for such characteristics as low resistance electrical interconnections, low resistance electrical contacts and compatibility with other microelectronics processes.

Various conductor materials have been employed in patterned microelectronics layers in microelectronics devices and circuits. Although intrinsically low electrical resistance is generally a high priority requirement, other factors are also of significance. Thus, although aluminum and aluminum alloys are widely employed as electrical interconnection materials in microelectronics, the relatively low melting point and chemical and metallurgical reactivity of these materials may not serve the purpose of the design or fabrication scheme. Materials such as tungsten, polycrystalline silicon, silicide compounds and other refractory metal compounds are conductive materials which may be conveniently formed in patterned layers, and which may offer advantages in some cases due to their high melting temperatures.

Electrical connections may be formed employing patterned layers of metal silicide compounds, which are conductor materials with relatively low electrical resistance and high melting temperatures. When such metal silicide conductor materials are employed within microelectronics fabrications in such a fashion as to form self-aligned silicide interconnections and contacts, such self-aligned silicide interconnections are referred to as salicide interconnections and contacts. Such self-alignment character may be achieved, for example, by etching contact regions through a dielectric layer to an underlying polycrystalline silicon conductor layer and depositing thereupon an appropriate metal layer. Subsequent treatment such by, for example, rapid thermal heating brings about formation of the silicide compound between the polysilicon and metal layers in the contact regions only, whereafter the superfluous metal and polysilicon may be removed. Such salicide layers are commonly employed as gate electrodes for field effect transistor (FET) devices. Such salicide gate electrodes are generally provided with adjacent dielectric spacer layers.

Among the requirements for fabrication of complex, high-density microelectronics devices and circuits such as memory cell arrays is the need to form local interconnections or crossovers, which are electrical interconnections bridging between adjacent contact regions separated by insulating or isolation regions. For example, an array of memory cells may require a personalization interconnection scheme which is a series of unique local inter-cell interconnections or crossovers to give that particular memory array its personality or unique feature, such as a read-only memory (ROM). The possibility of non-symmetrical patterns and the likelihood of relatively sparsely populated features in such a cross-over pattern may lead to difficulties in subsequent processing of the microelectronics fabrication, particularly with respect to maintaining planarization of the resulting upper surfaces of the fabrication. This is particularly likely to cause problems when conductor materials which are very hard and brittle, such as tungsten, are employed because of their high temperature capability.

Because of their more advantageous physical properties, salicide interconnection layers have become increasingly widely employed in microelectronics fabrications. The selfaligning feature and inherently low electrical resistance of many metal silicide materials are especially important as dimensions and design ground rules have continued to diminish. However, the employment of salicide interconnections and contacts to form cross-over electrical contacts is not without problems. For example, the employment of conventional microelectronics fabrication methods to form patterned layers of insulating material, polysilicon, metal silicide and the like and to form low resistance interconnections may be expensive and result in defects, low yields and reliability problems.

It is thus towards the goal of forming within a microelectronics fabrication a low resistance local electrical interconnection or cross-over for bridging over insulating regions which is compatible with further processing that the present invention is generally directed.

Methods and materials are known in the art of microelectronics fabrication for formation of cross-over bridging electrical contacts over insulating regions to two or more contact regions with low electrical resistance, high reliability and compatibility with microelectronics fabrication processes.

For example, Holloway et al., in U.S. Pat. No 4,657,628, disclose a method fort forming patterned local interconnects to source and drain regions of different FET devices. The method employs the formation of titanium silicide in the source and drain device contact regions, and interconnecting them with a patterned titanium nitride conductor layer.

Further, Tang et al., in U.S. Pat. No. 5,010,032, disclose a method for formation of both p+and n+gates in a CMOS device wherein there is an interconnection of the devices employing a patterned titanium nitride layer. The interconnection is made by placing the titanium nitride layer in contact with titanium silicide contact regions formed upon the sources, gates and drains of the FETs in the CMOS device.

Still further, Kuo, in U.S. Pat. No. 6,083,847, discloses a local interconnection method for FET gate electrodes. The method employs the selective removal of the dielectric sidewall spacer of a polysilicon gate electrode and formation of a metal silicide layer after deposition of the metal on the exposed gate electrode and substrate contact areas.

Yet still further, Dawson et al., in U.S. Pat. No. 6,096,639, disclose a method for forming a local interconnect (LI) structure to selected regions of a semiconductor device. The method employs the formation of silicide regions where electrical contact is to be made, and then depositing an insulating layer and a transition or refractory metal layer which is then patterned to form the local interconnect to the silicide regions.

Further still, Lin et al., in U.S. Pat. No. 6,100,191, disclose a method for forming self-aligned silicide layers on a substrate. The method employs a deposition of a non-conformal silicon layer selectively on the substrate followed by a deposition of a refractory metal layer thereupon. A thermal annealing step then converts the superposed layers to a self-aligned silicide layer.

Finally, Manning, in U.S. Pat. No. 6,117,761, discloses a method for forming self-aligned silicide interconnection to polysilicon layers separated by non-conducting gaps. The method employs the deposition of a metal layer over a contact opening in a substrate exposing first and second silicon layers, followed by formation of a silicon layer over the metal layer. A thermal sintering step forms a silicon-rich silicide region over the first and second silicon layers, thus bridging the gap.

Desirable in the art of microelectronics fabrication are further novel methods for the formation of cross-over electrical interconnections bridging over insulating regions and employing low resistance, high temperature conductor materials. It is towards these goals that the present invention is more specifically directed.

SUMMARY OF THE INVENTION

A first object of the present invention is to provide a method for forming within a substrate employed within a microelectronics fabrication an electrical cross-over interconnection bridging over an insulating region.

A second object of the present invention is to provide a method in accord with the first object of the present invention, where the cross-over interconnection is formed employing a low resistance conductor material.

A third object of the present invention is to provide a method in accord with the first and second objects of the present invention, where the electrical crossover is formed from a high temperature material compatible with conventional microelectronics fabrication methods.

A fourth object of the present invention is to provide in accord with the first object of the present invention, the second object of the present invention and/or the third object of the present invention, a structure for an electrical cross-over interconnection bridging between conductive regions separated by an insulating region.

A fifth object of the present invention is to provide a method in accord with the first object of the present invention, the second object of the present invention, the third object of the present invention and/or the fourth object of the present invention, where the method is readily commercially implemented.

In accord with the objects of the present invention, there is provided by the present invention a method for forming within a substrate employed within a microelectronics fabrication an electrical cross-over interconnection to two or more contact regions bridging an insulating region between the contact regions. To practice the invention, there is provided a substrate with electrical contact regions. There is formed over the substrate a thin layer formed of silicon oxide dielectric material. There is formed over the silicon oxide dielectric layer a polycrystalline silicon layer. There is then etched employing a conventional photoresist etch mask layer the electrical cross-over pattern into the polysilicon and silicon oxide dielectric layers. There is then stripped the photoresist etch mask layer. There is then etched away a small portion of the silicon oxide dielectric layer, leaving a narrow peripheral gap between the overhanging polysilicon layer and the contact region in the underlying substrate. There is then formed a layer of metal over the substrate which upon thermal treatment forms a metal silicide over the surface of the polysilicon and within the narrow gap between the polysilicon and the substrate, resulting in the formation of an electrical connection in the peripheral gap between the polysilicon layer and the substrate contact regions, and hence a self-aligned silicide or salicide crossover electrical interconnection.

The present invention provides a method for forming within a substrate employed within a microelectronics fabrication a structure which affords an electrical cross-over interconnection bridging interconnection between contact regions separated by an insulating region. The present invention may be employed to form cross-over electrical connections within substrates employed within microelectronics fabrications including but not limited to integrated circuit microelectronics fabrications, charge coupled device microelectronics fabrications, solar cell microelectronics fabrications, optoelectronics microelectronics fabrications, ceramic substrate microelectronics fabrications and flat panel display microelectronics fabrications.

The method of the present invention employs materials and methods which are known in the art of microelectronics fabrication, but in a novel order and sequence to bring about a novel structure. Therefore the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming within a substrate employed within a microelectronics fabrication an electrical cross-over interconnection, bridging between contact regions separated by insulating regions, formed employing low electrical resistance material compatible with microelectronics processing. To achieve the foregoing objects, the present invention provides a substrate with electrical contact regions over which is formed a blanket polysilicon semiconductor layer There is then formed over the substrate a blanket silicon oxide dielectric layer. There is then etched the polysilicon and silicon oxide layers through a photoresist etch mask layer to form patterned superimposed layers of polysilicon and silicon oxide in physical contact with the underlying substrate contact regions. There is then stripped the photoresist etch mask. There is then etched the silicon oxide dielectric layer at the periphery of the polysilicon pattern to remove a small amount of silicon oxide at the edges of the pattern. There is then treated the substrate to a metal deposition and a rapid thermal exposure to form a metal silicide compound on the surface and periphery of the polysilicon pattern, which forms the electrical contact between the polysilicon pattern and the underlying substrate contact region.

First Preferred Embodiment

Figure 1:
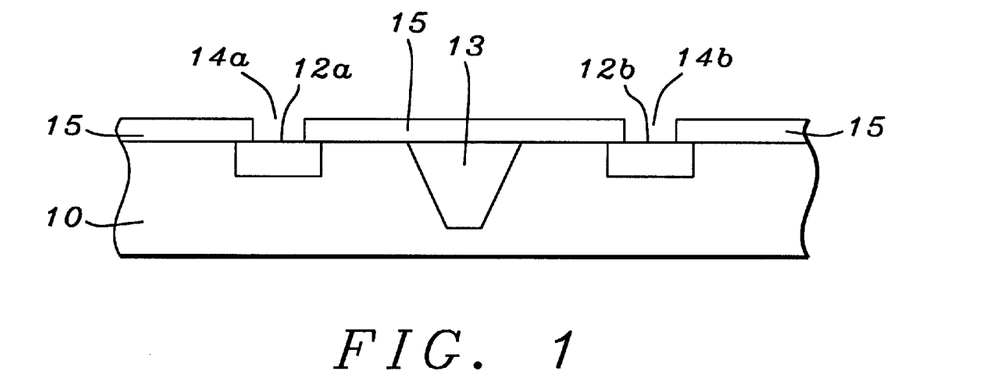
FIG. 1, FIG. 2, FIG. 3, FIG. 4 and FIG. 5 show a series of schematic cross-sectional drawings illustrating the results of progressive stages in forming within a substrate employed within a microelectronics fabrication an electrical cross-over contact bridging between two or more electrical contact regions separated by an insulating region within the substrate, in accord with a general embodiment of the present invention which is a first preferred embodiment of the present invention.

Referring now to FIGS. 1–5, there is shown a series of schematic cross-sectional diagrams illustrating the results of progressive stages of forming a cross-over electrical interconnection, bridging between contact regions within a substrate employed within a microelectronics fabrication, employing conductor material with low electrical resistance which is compatible with microelectronics processing, in accord with a first preferred embodiment of the present invention. Shown in FIG. 1 is a schematic cross-sectional diagram of the substrate at an early stage in its fabrication in accord with the first preferred embodiment of the present invention.

Shown in FIG. 1 is a substrate 10 having formed therein electrical contact regions 12a and 12b accessible through contact via holes 14a and 14b formed through electrical insulating layer 15. The contact regions may be separated by optional insulating or isolation regions 13.

The substrate 10 shown in FIG. 1 may be the substrate itself employed within the microelectronics fabrication, or alternatively the substrate 10 may be any one of several layers of microelectronics material formed upon the substrate 10 itself The substrate 10 may be formed of microelectronics materials including but not limited to microelectronics conductor materials, microelectronics semiconductor materials and microelectronics dielectric materials. Preferably, the substrate 10 is formed of microelectronics semiconductor material.

The electrical contact regions 12a and 12b shown in FIG. 1 are of any conductor material formed within the substrate 10 by methods as are known in the art of microelectronics fabrication which is suitable for forming electrical contact to polysilicon or metal silicide materials. Preferably the contact regions 12a and 12b are formed of silicon or conductive silicon compounds. The contact via holes 14a and 14b are formed employing conventional methods known in the art of microelectronics fabrication through the insulating dielectric layer 15. Preferably the insulating layer 15 is formed employing a dielectric material including but not limited to the group of materials such as silicon containing dielectric materials formed employing methods including but not limited to chemical vapor deposition, sputtering, vacuum evaporation, chemical reaction, plasma reaction and the like. The optional electrical insulating or isolation region 13 may be formed employing dielectric materials or reverse polarity semiconductor regions.

Figure 2:
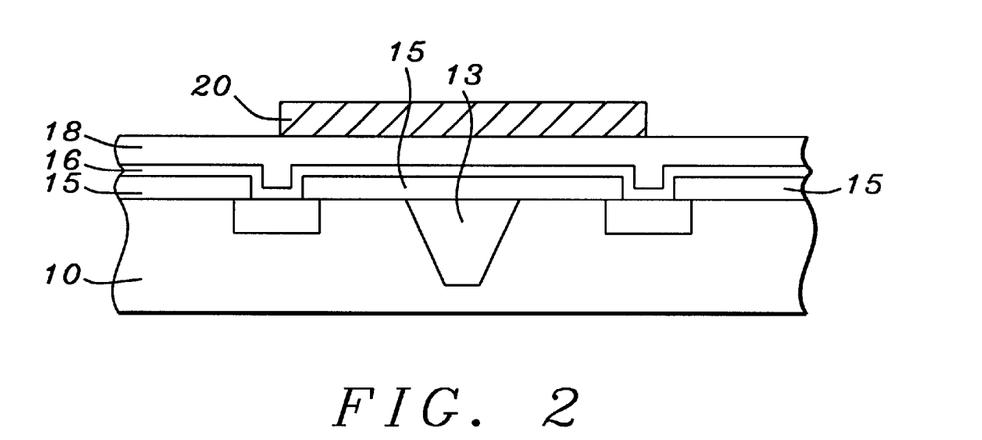

Referring now more particularly to FIG. 2, there is shown a schematic cross-sectional diagram illustrating the results of further processing of the microelectronics fabrication whose schematic cross-sectional diagram is illustrated in FIG. 1 in accord with the first preferred embodiment of the present invention. Shown in FIG. 2 is a microelectronics fabrication otherwise equivalent to the microelectronics fabrication shown in FIG. 1, but where there has been formed a blanket dielectric layer 16 and a blanket polycrystalline silicon layer 18 over the substrate 10. Formed over the substrate 10 is a patterned photoresist etch mask layer 20.

With respect to the blanket dielectric layer 16 shown in FIG. 2, the blanket dielectric layer 16 is formed employing a silicon containing dielectric material. Preferably, the blanket dielectric layer 16 is a silicon oxide dielectric material formed to a thickness of about 160 angstrom-ns employing thermal oxidation of tetra-ethyl-ortho-silicate (TEOS) vapor at low pressure under the following conditions: (1) pressure about 0.3 torr; (2) temperature about 700 degrees centigrade; and (3) carrier gas nitrogen.

With respect to the polycrystalline silicon layer 18 shown in FIG. 2, the polycrystalline silicon layer 18 is formed employing deposition in a furnace. Preferably, the polycrystalline silicon layer 18 is formed to a thickness of about 2000 angstroms. employing the following process conditions: (1) source gas silane ($SiH_4$); (2) carrier gas nitrogen; (3) pressure 0.11 torr; (4) temperature 620 degrees centigrade.

With respect to the patterned photoresist etch mask layer 20 shown in FIG. 2, the patterned photoresist etch mask layer 20 is formed employing materials and processes as are known in the art of microelectronics fabrication.

Figure 3:
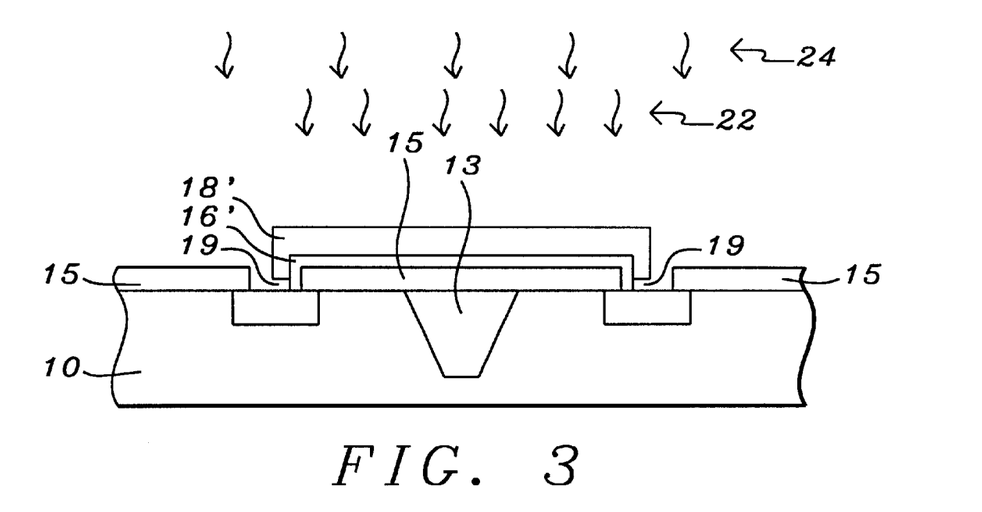

Referring now more particularly to FIG. 3, there is shown a schematic cross-sectional drawing illustrating the results of further processing of the microelectronics fabrication whose schematic cross-sectional drawing is shown in FIG. 2 in accord with the first preferred embodiment of the present invention. Shown in FIG. 3 is a schematic cross-sectional drawing of a microelectronics fabrication equivalent to that shown in FIG. 2, but where there has been etched employing the photoresist etch mask layer 20 an interconnection pattern into the polysilicon layer 18' and the silicon oxide dielectric layer 16' to the substrate contact, regions 12a and 12b employing an etching environment 22. Following the etching, the photoresist etch mask layer 20 is stripped and the substrate 10 is treated to a dip etching step 24 to remove a portion of the silicon oxide dielectric layer 16' at the periphery 19 of the polysilicon pattern.

With respect to the etching environment 22 employed to etch the pattern into the polysilicon layer 18' and the silicon oxide dielectric layer 16', the etching environment 22 consists of a plasma formed employing the following process conditions: (1) temperature 60 degrees centigrade; (2) reactive gases chlorine ($Cl_2$) and hydrogen bromide (HBr); (3) reactive gas flow rates 95 and 140 standard cubic centimeters per second (sccm) respectively; (4) total pressure 3 millitorr; (5) power 640 watts; and (6) reaction time until end point detection.

With respect to the dip etching step 24, the dip etching step 24 removes about 60 angstroms of silicon oxide dielectric material. The dip etch process consists of: (1) chemical composition: hydrofluoric acid (HF) in water at a ratio of 1:100; (2) temperature about 23 degrees centigrade; and (3) time about 120 seconds.

Figure 4:
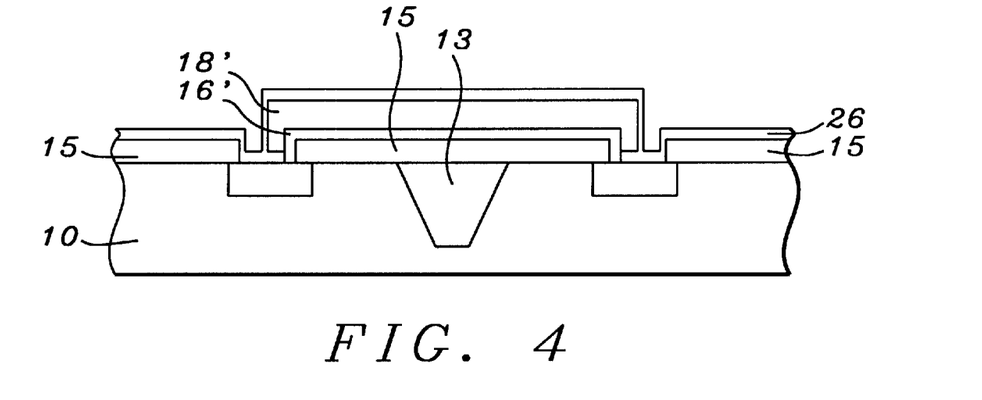

Referring now more particularly to FIG. 4, there is shown a schematic cross-sectional diagram illustrating the results of further processing of the microelectronics fabrication whose schematic cross-sectional diagram is shown in FIG. 3 in accordance with the first preferred embodiment of the present invention. Shown in FIG. 4 is a microelectronics fabrication otherwise equivalent to the microelectronics fabrication shown in FIG. 3, but where there has been formed over the substrate 10 a blanket layer of conductor material 26.

With respect to the blanket conductor layer 26 shown in FIG. 4, the blanket conductor layer 26 has been formed by methods which are known in the art of microelectronics fabrication, including but limited to vacuum evaporation, sputtering, chemical vapor deposition (CVD) and electrodeposition, employing conductor materials including but not restricted to metals, alloys, semiconductors and compounds. Preferably the blanket conductor layer 26 is a layer of the refractory metal titanium (Ti), formed to a thickness of about 300 to about 500 angstroms employing the method of sputtering.

Figure 5:
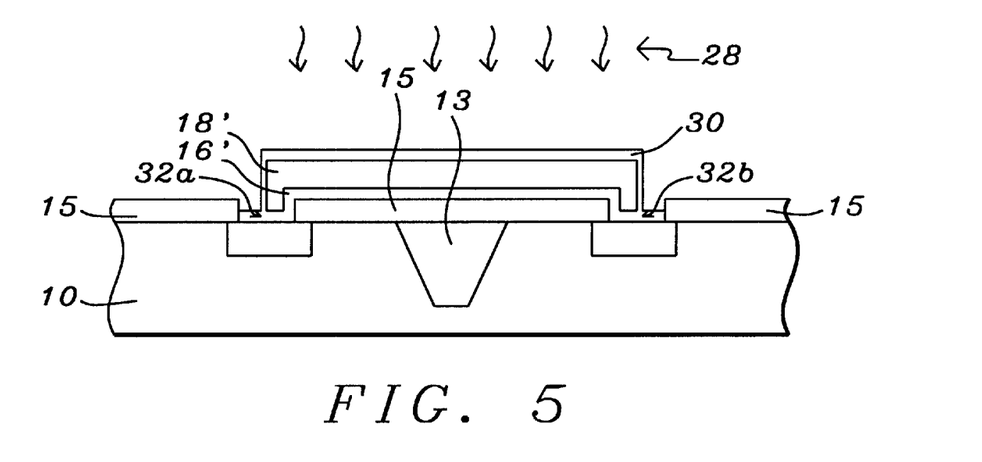

Referring now more particularly to FIG. 5, there is shown a schematic cross-sectional diagram illustrating the results of further processing of the microelectronics fabrication whose schematic cross-sectional diagram is shown in FIG. 4 in accord with the first preferred embodiment of the present invention. Shown in FIG. 5 is a microelectronics fabrication otherwise equivalent to the microelectronics fabrication shown in FIG. 4, but where there has been treated the substrate 10 to a rapid thermal anneal 28 to convert the exposed polycrystalline silicon 20 to metal silicide 30. Removal of excess conductor material not in contact with polycrystalline silicon results in the formation of a conducting electrical cross-over interconnection with electrical contacts 32a and 32b at the underlying substrate contact regions 12a and 12b, bridging the insulating region 16 in the substrate with a low electrical resistance cross-over structure.

With respect to the rapid thermal anneal 28 of the metal 26 and silicon to form the self-aligned silicide (salicide) electrical cross-over contact structure 30, the rapid thermal anneal 28 employs the following process conditions: (1) time about 30 seconds; (2) temperature about 830 degrees centigrade; (3) nitrogen gas environment. The refractory metals employed to form the metal silicide include but are not limited to titanium (Ti), molybdenum (Mo) and cobalt (Co). Preferably, Ti metal is employed to form self-aligned titanium silicide ($TiSi_2$) conductive layer of the salicide cross-over structure, to a thickness of greater than about 300 angstroms.

Within the first preferred embodiment of the present invention, there has been formed within a substrate employed within a microelectronics fabrication an electrical interconnection cross-over to contact regions within the underlying substrate bridging over insulation and/or isolation regions within the substrate separating the contact regions. The electrical interconnection cross-over structure is formed of low electrical resistance material compatible with microelectronics fabrication processes.

Second Preferred Embodiment

Referring now more particularly to FIGS. 6–10, there is shown a series of schematic cross-sectional diagrams illustrating the progression of various stages in the fabrication of an integrated circuit microelectronics fabrication in accord with a second preferred embodiment of the method of the present invention.

Figure 6:
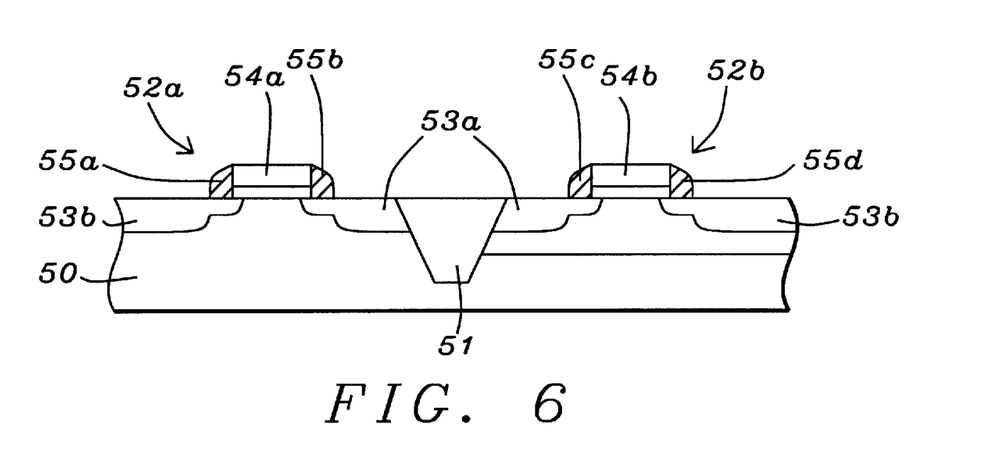
FIG. 6, FIG. 7, FIG. 8, FIG. 9 and FIG. 10 show a series of schematic cross-sectional diagrams illustrating the results of progressive stages in forming within a semiconductor substrate employed within an integrated circuit microelectronics fabrication an electrical cross-over contact bridging between two or more electrical contact regions separated by an insulating region within the substrate, employing a self-aligned metal silicide layer, wherein the method may also simultaneously form the self-aligned silicide gates of FET devices formed on the semiconductor substrate, in accord with a more specific embodiment of the present invention which is a second preferred embodiment of the present invention.

FIG. 6 is a schematic cross-sectional diagram of an integrated circuit microelectronics fabrication at an early stage in its fabrication. Shown in FIG. 6 is a semiconductor substrate 50 employed within an integrated circuit microelectronics fabrication having formed therein field effect transistor (FET) devices 52a and 52b consisting of source and drain electrode regions 53a and 53b and gate electrodes 54a and 54b with dielectric spacers 55a–d. The FET devices are separated by an isolation region 51.

With respect to the semiconductor substrate 50 shown in FIG. 6, the semiconductor substrate 50 is analogous or equivalent to the substrate 10 shown in FIG. 1 of the first preferred embodiment of the present invention. Preferably the semiconductor substrate 50 is a silicon semiconductor substrate.

With respect to the FET devices 52a and 52b shown in FIG. 6, the FET devices 52a and 52b are formed in the semiconductor substrate 50 employing materials and methods as are well-known in the art of integrated circuit microelectronics fabrication. With respect to the gate electrodes 54a and 54b of the FET devices shown in FIG. 6, the gate electrodes 54a and 54b are optionally self-aligned polycrystalline silicon gate electrodes. With respect to the isolation region 51 shown in FIG. 6, the isolation region 51 preferably is an isolation trench filled with a dielectric material such as silicon oxide.

Figure 7:
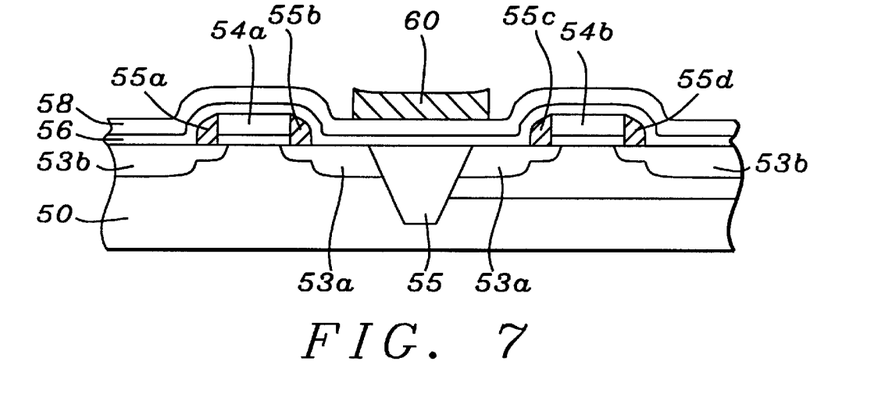

Referring now more particularly to FIG. 7, there is shown a schematic cross-sectional diagram illustrating the results of further processing of the integrated circuit microelectronics fabrication whose schematic cross-sectional diagram is shown in FIG. 6. Shown in FIG. 7 is an integrated circuit microelectronics fabrication equivalent to the integrated circuit microelectronics fabrication shown in FIG. 6, but where there has been formed a blanket layer of silicon oxide dielectric material 56 over the semiconductor substrate. Formed over the substrate is a blanket layer of polycrystalline silicon 58. Formed over the substrate 50 is a patterned photoresist etch mask layer 60.

With respect to the blanket layer of silicon oxide dielectric material 56 shown in FIG. 7, the blanket silicon oxide layer 56 is equivalent or analogous to the silicon oxide blanket dielectric layer 16 shown in FIG. 2 of the first preferred embodiment of the present invention.

With respect to the blanket polysilicon layer 58 shown in FIG. 7, the blanket polysilicon layer 58 is analogous or equivalent to the blanket polysilicon layer 18 shown in FIG. 2 of the first preferred embodiment of the present invention.

With respect to the patterned photoresist etch mask layer 60 shown in FIG. 7, the patterned photoresist etch mask layer 60 is analogous or equivalent to the patterned photoresist etch mask layer 20 shown in FIG. 2 of the first preferred embodiment of the present invention.

Figure 8:
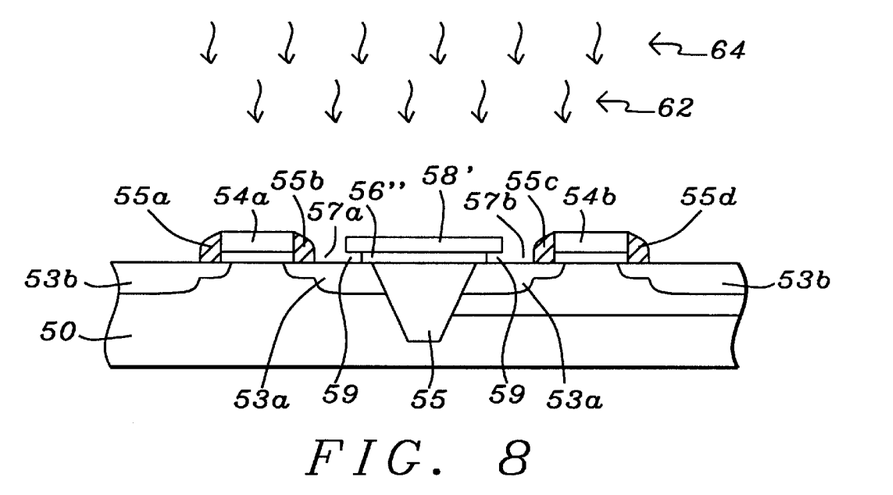

Referring now more particularly to FIG. 8, there is shown a schematic crosssectional diagram illustrating the results of further processing of the integrated circuit microelectronics fabrication whose schematic cross-sectional diagram is shown in FIG. 7 in accord with the first preferred embodiment of the present invention. Shown in FIG. 8 is an integrated circuit microelectronics fabrication equivalent to the integrated circuit microelectronics fabrication shown in FIG. 7, but where there has been etched the pattern of the photoresist etch mask layer 60 through the polysilicon layer 58' and the silicon oxide dielectric layer 56' to the contact regions 57a and 57b, employing etching environment 62. The etching is followed by stripping the photoresist etch mask layer 60. The semiconductor substrate 50 is etched in a dip etch solution 64 to remove a portion of the silicon oxide dielectric layer 56" at the periphery 59 of the patterned polysilicon-silicon oxide composite layer.

With respect to the etching environment 62 shown in FIG. 8, the etching environment 62 is analogous or equivalent to the etching environment shown in FIG. 3 of the first preferred embodiment of the present invention.

With respect to the dip etch 64 employed to remove a portion of the silicon oxide dielectric layer 56" at the periphery 59 of the patterned polysilicon layer 58', the dip etch 64 is analogous or equivalent to the dip etch 24 shown in FIG. 3 of the first preferred embodiment of the present invention.

Figure 9:
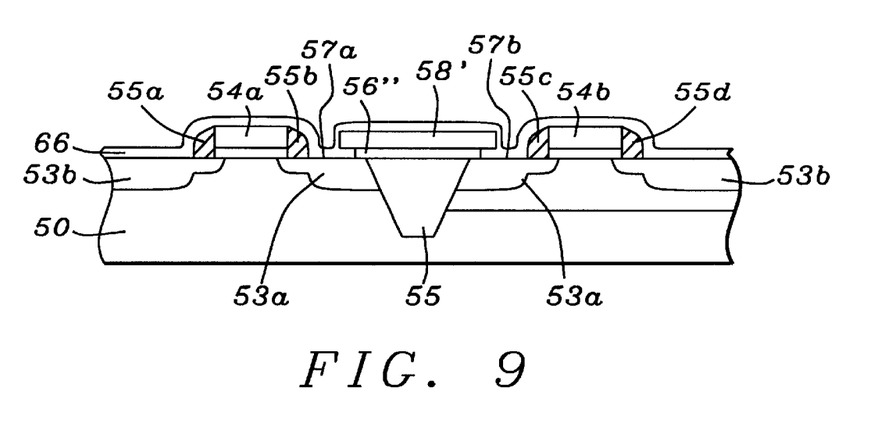

Referring now more particularly to FIG. 9, there is shown a schematic cross-sectional diagram illustrating the results of further processing of the integrated circuit microelectronics fabrication whose schematic cross-sectional diagram is shown in FIG. 8. Shown in FIG. 9 is an integrated circuit microelectronics fabrication equivalent to the integrated circuit microelectronics fabrication shown in FIG. 8, but where there has been formed over the substrate a blanket refractory metal layer 66.

With respect to the blanket refractory metal layer 66 shown in FIG. 9, the blanket layer 66 is analogous or equivalent to the blanket conductor layer 26 shown in FIG. 4 of the first preferred embodiment of the present invention.

Figure 10:
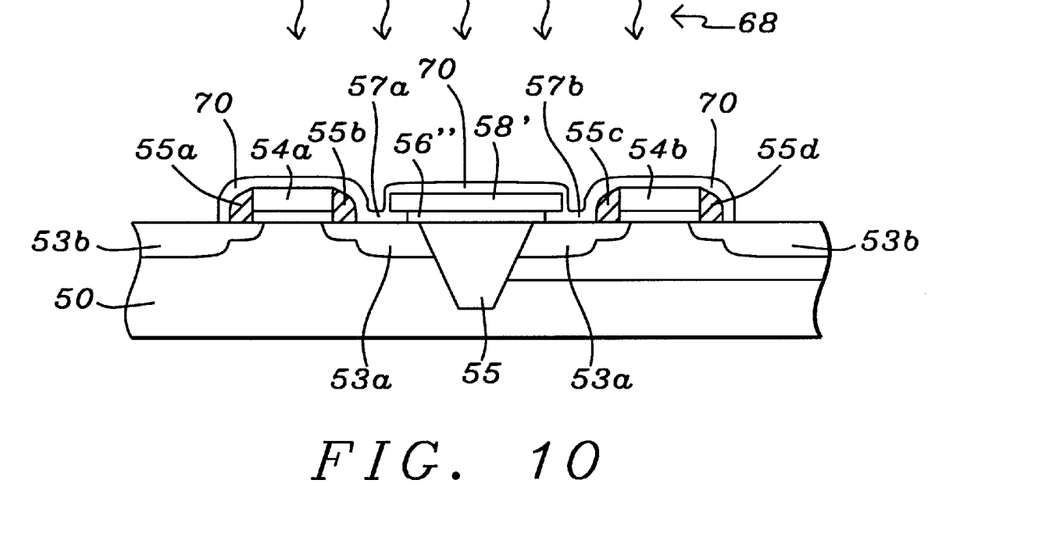

Referring now more particularly to FIG. 10, there is shown a schematic cross-sectional diagram illustrating the final results of processing of the integrated circuit microelectronics fabrication whose schematic cross-sectional diagram is shown in FIG. 9. Shown in FIG. 10 is an integrated circuit microelectronics fabrication otherwise equivalent to the integrated circuit microelectronics fabrication shown in FIG. 9, but where there has been treated the semiconductor substrate to a rapid thermal annealing process 68 to convert the blanket metal layer 66 to a metal silicide compound layer 70 at the interface between the metal layer and the silicon surfaces. Subsequently the excess unreacted metal is removed, leaving a layer of metal silicide covering the polysilicon 70, and electrically connecting the silicon-metal silicide composite layer at the substrate contact regions 57a and 57b by the cross-over 70.

With respect to the rapid thermal annealing process 68 shown in FIG. 10, the rapid thermal annealing process 68 is analogous or equivalent to the rapid thermal annealing process 28 shown in FIG. 5 of the first preferred embodiment of the present invention.

With respect to the electrical contact at the periphery of the polysilicon-metal silicide composite layer at the substrate contact regions 57a and 57b, the contact layers 70b and 70c are analogous or equivalent to the contact layers 32a and 32b shown in FIG. 5 of the first preferred embodiment of the present invention.

The method of the second preferred embodiment of the present invention has been employed to form within a semiconductor substrate employed within an integrated circuit microelectronics fabrication an electrical interconnection cross-over to contact regions within the semiconductor substrate, bridging an insulating/isolation region between the contact regions. The cross-over is formed of a patterned polysilicon layer contiguous with a metal layer, which has then reacted during a thermal annealing treatment to form a metal silicide at the periphery of the patterned polysilicon layer where it is forms an electrical contact to the underlying silicon contact regions.

Figure 11:
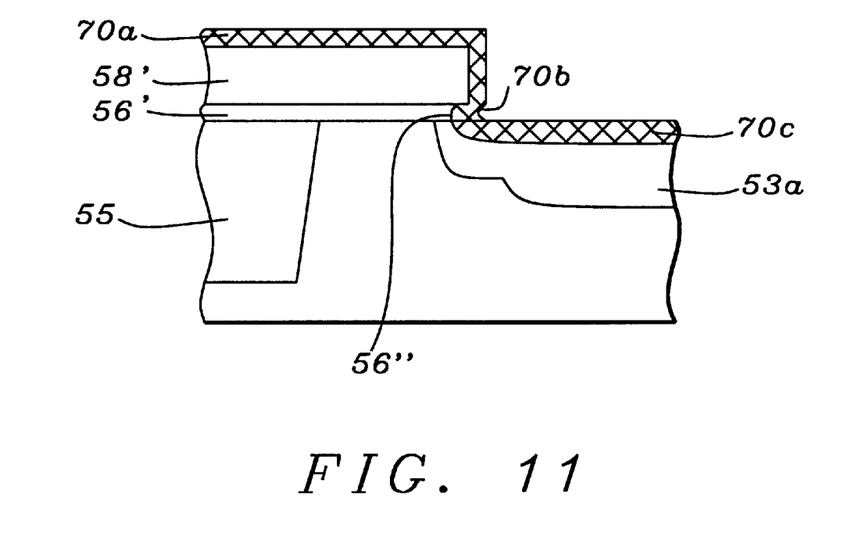
FIG. 11 is a schematic cross-sectional drawing illustrating in detail the structure of an electrical cross-over interconnection bridging between contact regions separated by insulating region formed in accordance with the general method of the present invention.

Referring now more particularly to FIG. 11, there is shown a schematic cross-sectional drawing illustrating the structure of the electrical connection provided by the present invention in more detail. Shown in FIG. 11 is the patterned polysilicon layer 58' and the patterned etched silicon oxide layer 56' after the metal deposition and rapid thermal annealing to form the metal silicide regions 70a, 70b and 70c. The excess metal layer remaining after the rapid thermal annealing treatment has been removed, leaving the metal silicide layer formed over the polysilicon 70a and over the substrate silicon surface 70c. In the gap where there has been etched away a portion of the silicon oxide layer 56", the metal silicide 70b has formed from the polysilicon layer and the silicon substrate to fill the gap and form the electrical connection between the patterned polysilicon layer and the substrate, thus bridging the insulating region constituted by the silicon oxide dielectric layer 56' and the optional isolation region 51.

During the formation of metal silicide conductive crossover structures in the second preferred embodiment of the present invention, there may optionally at the same time be formed self-aligned silicide, or salicide, gate electrodes for FET devices if such are already within the semiconductor substrate of the integrated circuit microelectronics fabrication under consideration. Likewise, other optional regions of the device which suitably consist of silicon may be converted to silicide regions if so desired.

As is understood by a person skilled in the art, the preferred embodiments of the present invention are illustrative of the invention rather than limiting of the present invention. Revisions and modifications may be made to materials, structures and dimensions through which is provided the preferred embodiments of the present invention while still providing useful embodiments of the present invention which are within the spirit and scope of the present invention, as defined by the appended claims.

What is claimed is:

1. A method for forming within a substrate employed within a microelectronics fabrication an electrical interconnection cross-over bridging between conductive regions formed within the substrate comprising:

(a) providing a substrate having formed therein at least two conductive regions separated by non-conductive or isolation regions and thereon an insulating layer patterned to form contact openings respectively to each of at least two of said conductive regions;

(b) forming over the insulating layer, a blanket silicon oxide dielectric layer;

(c) forming over the blanket silicon oxide dielectric layer, a blanket polycrystalline silicon (polysilicon) layer;

(d) forming over the blanket polycrystalline silicon layer, a photoresist etch mask layer, patterned to define a polysilicon bridge element between and extending partially over at least two of said contact openings;

(e) etching the pattern of the photoresist etch mask layer into and through the polysilicon layer and the silicon oxide dielectric layer to the substrate, (f) stripping the patterned photoresist etch mask layer;

(g) removing by dip etching a portion of the silicon oxide dielectric layer at the periphery of the patterned polysilicon and silicon oxide dielectric layers;

(h) directly after said dip etching, forming over the substrate a blanket layer of conductive material;

(i) treating the substrate to a rapid thermal annealing process to selectively form a conductive compound over regions wherein said conductive material is in contact with silicon; and (j) removing excess unreacted conductor material thereby forming a continuous conductive cross-over bridging between respective said at least two conductive regions.

2. The method of claim 1 wherein the blanket silicon oxide dielectric layer is formed employing chemical vapor deposition (CVD) from tetra-ethyl-ortho-silicate (TEOS) vapor to a thickness of about 160 angstroms.

3. The method of claim 1 wherein the blanket polysilicon layer is formed employing a furnace process comprising these operating conditions:

pressure about 0.11 torr;

temperature about 620 degrees centigrade;

silane ($SiH_4$) reactive gas;

thickness about 2000 angstroms.

4. The method of claim 1 wherein the dip etch of a portion of the silicon oxide dielectric layer removes about 60 angstroms of silicon oxide and is performed employing process conditions comprising:

chemical concentration 1:100 parts hydrofluoric acid (HF) in water ($H_2O$);

temperature about 23 degrees centigrade, time about 120 seconds.

5. The method of claim 1 wherein the conductor material is a refractory metal selected from the group consisting of:

titanium;

cobalt; and molybdenum.

6. The method of claim 1 wherein the conductor layer is formed to a thickness of from about 300 to about 500 angstroms.

7. The method of claim 1 wherein the rapid thermal annealing process is a temperature excursion from about 720 degrees centigrade to about 830 degrees centigrade in about 30 seconds.

8. The method of claim 7 wherein the rapid thermal annealing process forms a conductive compound layer whose thickness is greater than about 300 angstroms.

9. A method for forming within a semiconductor substrate employed within an integrated circuit microelectronics fabrication an electrical interconnection cross-over bridging between conductive regions and/or device contact regions formed within the semiconductor substrate comprising:

(a) providing a semiconductor substrate having formed therein at least two exposed conductive regions and/or device contact regions separated by non-conductive regions and/or isolation regions;

(b) forming over the semiconductor substrate, a blanket silicon oxide dielectric layer;

(c) forming over the blanket silicon oxide dielectric layer, a blanket polysilicon layer;

(d) forming over the blanket polysilicon layer, a photoresist etch mask layer, patterned to define a polysilicon bridge element between and extending partially over each of at least two of said exposed conductive regions and/or device contact regions;

(e) etching the pattern of the photoresist etch mask layer into and through the polysilicon layer and the silicon oxide dielectric layer to the respective conductive regions and/or device contact regions thereby forming a polysilicon bridging element;

(f) stripping the photoresist etch mask layer;

(g) removing by dip etching a portion of the silicon oxide dielectric layer under the periphery of the polysilicon bridging element;

(h) directly after said dip etching, forming over the substrate, a blanket layer of refractory metal;

(i) treating the substrate to a rapid thermal annealing process to form a refractory metal silicide compound at interfaces wherein said refractory layer is in physical contact with silicon thereby forming conductive interconnection between the polysilicon bridging element and the least two said exposed conductive regions and/or device contact regions; and (j) removing unreacted refractory metal.

10. The method of claim 9 wherein the semiconductor substrate is a silicon semiconductor substrate.

11. The method of claim 9 wherein the blanket silicon oxide dielectric layer is formed employing chemical vapor deposition (CVD) method from tetra-ethyl-ortho-silicate (TEOS) vapor to a thickness of about 160 angstroms.

12. The method of claim 9 wherein the blanket polysilicon layer is formed employing a furnace process operating under conditions comprising:

pressure about 0.11 torr;

temperature about 820 degrees centigrade;

silane ($SiH_4$) reactive gas; and thickness about 2000 angstroms.

13. The method of claim 9 where the dip etch of a portion of the silicon oxide dielectric layer removes about 60 angstroms of silicon oxide material and is performed employing process conditions comprising:

chemical concentration 1:100 parts hydrofluoric acid (HF) in water ($H_2O$);

temperature about 23 degrees centigrade; and time about 120 seconds.

14. The method of claim 9 wherein the refractory metal is selected form the group consisting of:

titanium;

cobalt; and molybdenum.

15. The method of claim 9 wherein the refractory metal layer is formed to a thickness of from about 300 to about 500 angstroms.

16. The method of claim 15 wherein the thickness of refractory metal silicide is greater than about 300 angstroms.

17. The method of claim 9 wherein the rapid thermal annealing process is a temperature excursion of from about 720 degrees centigrade to about 830 degrees centigrade in about 30 seconds.

* * * * *